(12) United States Patent
Li

(10) Patent No.: US 7,940,391 B2
(45) Date of Patent: May 10, 2011

(54) PRE-ALIGNED METROLOGY SYSTEM AND MODULES

(75) Inventor: Shifang Li, Pleasanton, CA (US)

(73) Assignee: Tokyo Electron Limited, Tokyo (JP)

( * ) Notice: Subject to any disclaimer, the term of this patent is extended or adjusted under 35 U.S.C. 154(b) by 517 days.

(21) Appl. No.: 12/169,373

(22) Filed: Jul. 8, 2008

(65) Prior Publication Data

US 2010/0007885 A1   Jan. 14, 2010

(51) Int. Cl.
G01B 11/00 (2006.01)
(52) U.S. Cl. ............... 356/400; 356/399; 356/237.2; 356/237.5
(58) Field of Classification Search .......... 356/399–401, 356/237.2–237.5
See application file for complete search history.

(56) References Cited

U.S. PATENT DOCUMENTS

| | | | |
|---|---|---|---|
| 6,433,878 B1 | 8/2002 | Niu et al. | |
| 6,538,731 B2 | 3/2003 | Niu et al. | |
| 6,778,273 B2 * | 8/2004 | Norton et al. | 356/364 |
| 6,785,638 B2 | 8/2004 | Niu et al. | |
| 6,891,626 B2 | 5/2005 | Niu et al. | |
| 6,943,900 B2 | 9/2005 | Niu et al. | |
| 7,064,829 B2 | 6/2006 | Li et al. | |
| 7,248,354 B2 * | 7/2007 | Kreh et al. | 356/237.5 |
| 7,280,229 B2 | 10/2007 | Li et al. | |
| 7,446,876 B2 * | 11/2008 | Harrison | 356/445 |
| 7,466,411 B2 * | 12/2008 | Riley et al. | 356/399 |
| 7,679,731 B2 * | 3/2010 | Tezuka | 356/72 |
| 7,742,163 B2 * | 6/2010 | Li | 356/237.5 |
| 2004/0267397 A1 | 12/2004 | Doddi et al. | |
| 2005/0192914 A1 | 9/2005 | Drege et al. | |
| 2005/0209816 A1 | 9/2005 | Vuong et al. | |

OTHER PUBLICATIONS

U.S. Appl. No. 12/050,053, filed Mar. 17, 2008 for Tian et al.
U.S. Appl. No. 12/050,919, filed Mar. 18, 2008 for Tian et al.
U.S. Appl. No. 12/057,316, filed Mar. 27, 2008 for Tian et al.
U.S. Appl. No. 12/057,332, filed Mar. 27, 2008 for Tian et al.
U.S. Appl. No. 12/057,346, filed Mar. 27, 2008 for Tian et al.
U.S. Appl. No. 12/059,610, filed Mar. 31, 2008 for Meng et al.
U.S. Appl. No. 12/141,754, filed Jun. 18, 2008 for Tian et al.
U.S. Appl. No. 12/141,867, filed Jun. 18, 2008 for Tian et al.

* cited by examiner

*Primary Examiner* — Tarifur R. Chowdhury
*Assistant Examiner* — Isiaka O Akanbi

(57) ABSTRACT

A Pre-Aligned Metrology System comprising a number of Pre-Aligned Metrology Assemblies and Pre-Aligned Metrology Modules for measuring a target on a wafer. The Pre-Aligned Metrology Assemblies and Pre-Aligned Metrology Modules can reduce the maintenance down time and decrease the cost of ownership (COO).

20 Claims, 3 Drawing Sheets

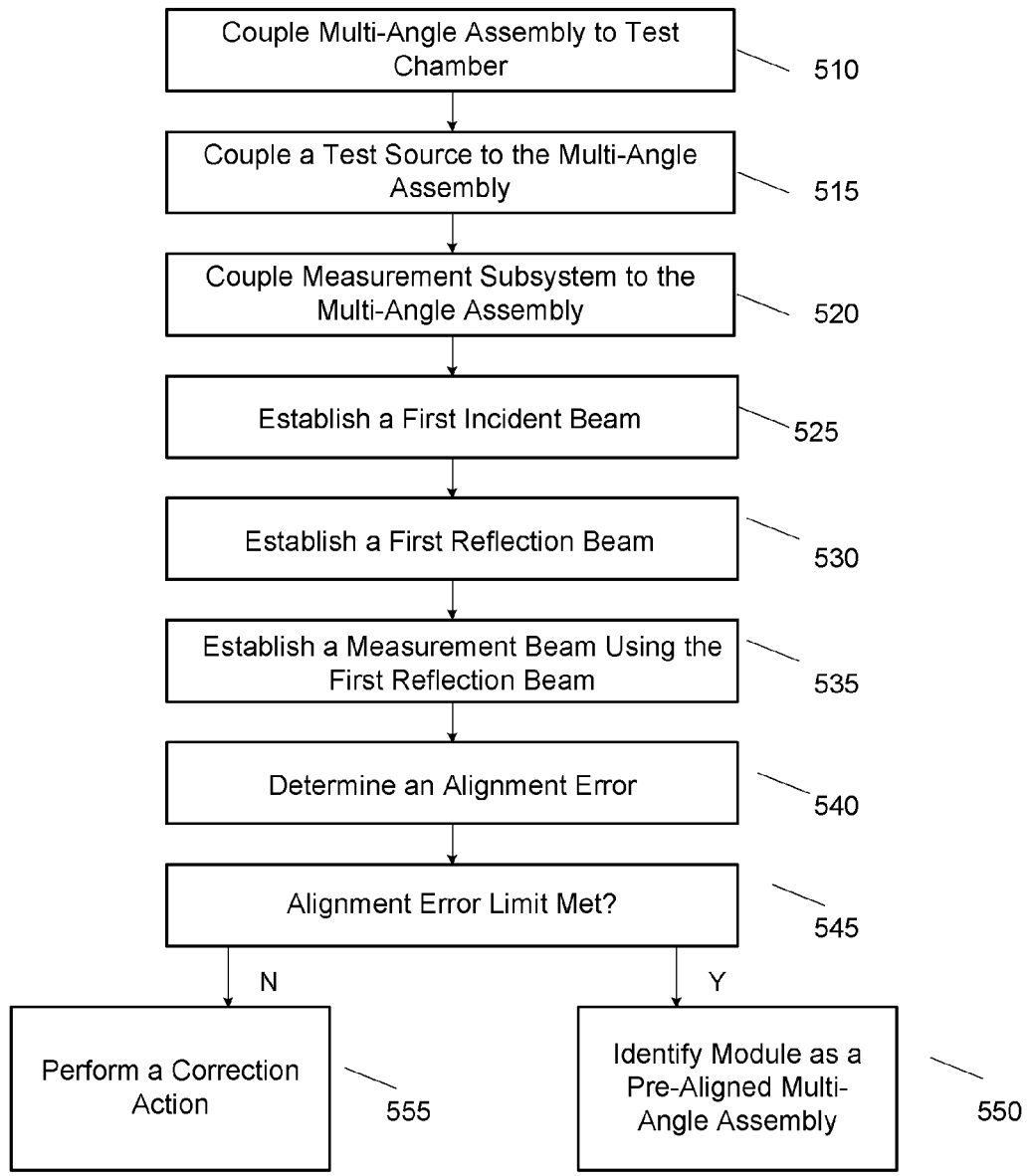
FIG. 3    500

PRE-ALIGNED METROLOGY SYSTEM AND MODULES

BACKGROUND OF THE INVENTION

1. Field of the Invention

The present invention relates to optical metrology, and more particularly to improving the optical metrology process using a pre-aligned metrology system that includes pre-aligned metrology assemblies and pre-aligned metrology modules.

2. Description of the Related Art

In the manufacture of integrated circuits, very thin lines or holes down to 10 nm or sometimes smaller are patterned into photoresist and then transferred using an etching process into a layer of material below on a silicon wafer. It is extremely important to inspect and control the width and profile (also known as critical dimensions or CDs) of these lines or holes. Traditionally the inspection of CDs that are smaller than the wavelength of visible light has been done using large and expensive scanning electron microscopes (SEM). As the structures patterned get smaller and smaller, the measurement precision and accuracy becomes much higher, and additional measurement data is needed for each wafer for process control. It is a very challenging for SEM to meet the metrology request in these cases. In many cases, manufacturers need to measure CD and profiles immediately after the photoresist has been patterned, a non-destructive metrology is needed to overcome photo-resist damage issues by SEM. For the case of process control or advanced equipment control, the measurement has to be non-destructive and the measurement tool need to be integrated into the process tools, such as wafer track that develops the photoresist or wafer-etching tool.

One general technique that has promise for integrated CD measurements is Scatterometry using Optical Digital Profilometry (ODP). Exemplary Scatterometry techniques are described in U.S. Pat. No. 6,538,731, entitled "System and Method for Characterizing Macro-Grating Test Patterns in Advanced Lithography and Etch Processes", by Niu, et al., issued on Mar. 25, 2003, and is incorporated in its entirety herein by reference. Exemplary ODP techniques are described in U.S. Pat. No. 6,433,878, entitled "Method and Apparatus for the Determination of Mask Rules Using Scatterometry", by Niu, et al., issued on Apr. 13, 2002, and is incorporated in its entirety herein by reference. This technique takes advantage of the fact that small periodic lines or holes diffract an incident light beam, and the properties of the light in each of the diffraction orders carries information of the lines and holes. In practice, the optical properties of zero-th diffraction order that is reflected (or, for transparent samples, transmitted) from the periodic structures are measured with an optical metrology sensor, and measured data is analyzed with as Scatterometry software, such as ODP. Often such parameters are measured versus wavelength, and in some cases, versus angle of incidence on the sample.

Optical metrology sensor measures the optical properties of the features on a wafer. These optical properties include a fraction of the incident energy reflected and polarization state change. These techniques are described in U.S. Pat. No. 7,064,829, entitled "Generic Interface for an Optical Metrology System", by Li, et al., issued on Jun. 20, 2006, and is incorporated in its entirety herein by reference. The optical metrology sensor can be designed to sense one or more of this optical properties. For example, a tool that measures energy changes is called a reflectometer, and tools that measure the polarization change are called ellipsometers. The optical metrology sensor typically uses photometric or spectral photometric detectors. For reflectometer, a standard reflector that the reflection is known is needed to deduct the fraction of energy reflected from the feature under test. For ellipsometer, the polarization state of the incident beam is known and stable by design and calibration, and thus standards are not required when the reflectivity is not of interest. The polarization state changes are deduced from the ratios of different Fourier components, thus the absolute light source intensity is not needed. This is often referred to as "self reference". In either case, the measurement quantity is the optical properties of the feature, and not the intensity of light in the diffraction orders although the optical properties is calculated from the intensities of the diffracted light and standard reflector in reflectometer case. The CD and profile information is obtained from an analysis of the diffraction signal using techniques such regression, library based systems, and machine learning systems such as those based on neural net techniques.

An optical metrology sensor involves directing an incident beam in one or most polarization state at a feature on a wafer, measuring the resulting diffraction signals, and measuring the signal from standard reflector in reflectometer case, the measured signs are first analyzed to find the optical properties of the feature, namely reflectivity or polarization state changes. The measured optical properties of the feature are analyzed to determine various characteristics of the feature. In semiconductor manufacturing, optical metrology is typically used for quality assurance, process control, and equipment control. For example, after fabricating a periodic grating in proximity to a semiconductor chip on a semiconductor wafer, an optical metrology system is used to determine the profile of the periodic grating. By determining the profile of the periodic grating, the quality of the fabrication process utilized to form the periodic grating, and by extension the semiconductor chip proximate the periodic grating, can be evaluated. Furthermore, the measured dimensions of features can be used to control the process equipment work conditions.

An integrated CD measurement tool must be both fast and compact, and must be non-destructive to the wafer under test. The wafer may also be loaded into the measurement tool at an arbitrary angle creating further complications for instruments that have a preferred measurement orientation with respect to certain wafer features.

Most of the optical metrology systems for CD measurement are stand-alone tools that are used as off-line application for monitoring the process. As the semiconductor roadmap goes to smaller and smaller nodes, more and more challenges on semiconductor process control to meet very tight tolerance while the structure becomes smaller. Integrated metrology tools are needed to measure the structures made on the wafer, and use the measured data for optimizing the process tools that the structures on the wafer has been made, or for adjusting the process tool conditions that the wafer is going to be further processed. For an integrated metrology tools, the reliability and availability need to be much higher than for off line tools, and the maintenance time needs to be significantly shorter than an off line tool.

SUMMARY OF THE INVENTION

The invention presents a Pre-Aligned Metrology Assembly that can be used in an integrated metrology sensor (IMS) that is configured using a plurality of Field Replaceable Units (FRUs). The invention presents a Pre-Aligned Metrology Assembly that is compact and well suited for integration into a compact IMS. The IMS can include one or more Pre-Aligned Metrology Assemblies, and the IMS can be used to measure structures 50 nm wide or smaller. The Pre-Aligned Metrology Assembly can be pre-aligned and calibrated so that it can be swapped in the field with minimum amount of time. The Pre-Aligned Metrology Assembly can be swapped as part of scheduled maintenance to improve the reliability and availability of the IMS.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 3 illustrates an exemplary flow diagram of an alignment procedure for a Metrology Assembly in accordance with embodiments of the invention.

DETAILED DESCRIPTION

Figure 1:
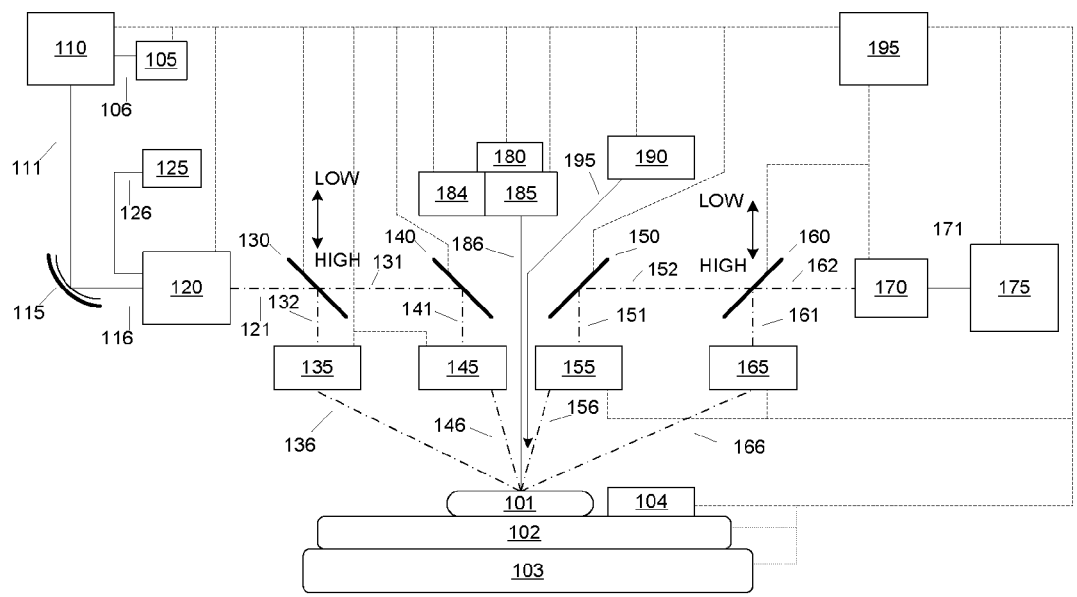
FIG. 1 depicts an exemplary optical metrology system in accordance with embodiments of the invention.

Reliability, availability, and performance are the most important parameters for semiconductor equipments in a modern fabrication environment. Many semiconductor manufacturers use optical metrology systems for thin-film and optical CD measurements that include stand-alone tools, and use off-line applications for process monitoring. As the semiconductor roadmap goes to smaller and smaller nodes, the tightened tolerances associated with the smaller structures become more challenging to obtain and verify using semiconductor process control applications. Thus, integrated metrology tools are required to meeting measurement time and accuracy on the smaller structures made on the wafer. In addition, the measured data from the integrated metrology sensor (IMS) can be used either to optimize the process tools that are being used to create the structures on the wafer, or to adjust the process tool conditions that are being used to further process the wafer. When the metrology tool is integrated as in-line equipment, much higher reliability and availability are needed because a faulty in-line tool can cause throughput problems in the associated production line.

The present invention provides a Pre-Aligned Metrology Assembly to improve tool reliability and to reduce the time to repair or maintain an in-line metrology tool and provide improved tool availability. Pre-Aligned Metrology Assembly can be more easily applied when a new metrology tool is designed and constructed. The entire metrology system can be separated into many Pre-Aligned Metrology Assemblies, and each one of the Pre-Aligned Metrology Assemblies can be assembled, aligned, calibrated, installed, and/or replaced with a minimum amount of system level adjustment.

The inventor believes that an improved IMS can be designed and built using compact Pre-Aligned Metrology Assemblies. The inventor believes that the use of Pre-Aligned Metrology Assemblies in an IMS can minimize and/or substantially eliminate system level alignment, diagnostic and calibration procedures that are presently required after a scheduled maintenance is performed, and after a repair of a system failure.

The invention can provide apparatus and methods for processing wafers using Pre-Aligned Metrology Assemblies having processing recipes and processing models associated therewith and the Pre-Aligned Metrology Assemblies can be used in real-time and non-real-time processing sequences that can include Double-Patterning (D-P) processing sequences, Double-Exposure (D-E) processing sequences, or other multi-step processing sequences. The D-P processing sequences can include one or more lithography-related procedures, one or more scanner-related procedures, one or more etch-related procedures, one or more deposition-related procedures, one or more measurement-related procedures, or one or more inspection-related procedures, or any combination thereof.

One or more multi-dimensional target structures having one or more identifiable features can be provided at various locations on a test wafer and can be used to align a non-aligned Metrology Assembly.

As structure sizes decrease below the 65 nm node, accurate processing and/or measurement data becomes more important and more difficult to obtain. Multi-step procedures can be used to more accurately process and/or measure these ultra-small devices and structures. The data from a D-P procedure can be compared with the accuracy, warning, and/or error limits, when a limit is exceeded, an alarm can be generated indicating a processing problem, and real-time correction procedures can be performed.

FIG. 1 shows an exemplary block diagram of an optical metrology system in accordance with embodiments of the invention. In the illustrated embodiment, an Integrated optical Metrology Sensor (IMS) 100 is shown that can comprise a platform subsystem 103, an alignment subsystem 102 coupled to the platform subsystem 103, an alignment sensor 104 coupled to the alignment subsystem 102, and these subsystems can be configured to align the wafer 101. One or more optical outputs 106 from the lamp subsystem 105 can be transmitted to an illuminator subsystem 110. One or more optical beams 111 can be sent from the illuminator subsystem 110 to a selector subsystem 115. The selector subsystem 115 can provide one or more optical beams 116 to a beam generator subsystem 120. In addition, a reference subsystem 125 can provide one or more reference beams to and/or exchange data with the beam generator subsystem 120 using path 126.

The Integrated Metrology Sensor (IMS) 100 can comprise a first selectable reflection subsystem 130 that can be used to direct one or more outputs 121 from the beam generator subsystem 120 as first outputs 131 when operating in a first mode "HIGH" or as second outputs 132 when operating in a second mode "LOW". When the first selectable reflection subsystem 130 is operating in the first mode "HIGH", one or more of the outputs 132 from the first selectable reflection subsystem 130 can be directed to a first reflection subsystem 140, and one or more outputs 141 from the first reflection subsystem 140 can be directed to a high angle focusing subsystem 145, When the first selectable reflection subsystem 130 is operating in the second mode "LOW", one or more of the outputs 132 from the first selectable reflection subsystem 130 can be directed to a low angle focusing subsystem 135. Alternatively, other modes may be used and other configurations may be used.

When the IMS 100 is operating in the first mode "HIGH", one or more of the outputs 146 from the high angle focusing subsystem 145 can be directed to the wafer 101. For example, a high angle of incidence can be used. When the IMS 100 is operating in the second mode "LOW", one or more of the outputs 136 from the low angle focusing subsystem 135 can be directed to the wafer 101. For example, a low angle of incidence can be used. Alternatively, other modes may be used and other configurations may be used.

The IMS 100 can comprise a high angle collection subsystem 155, a low angle collection subsystem 165, a second reflection subsystem 150, and a second selectable reflection subsystem 160.

When the IMS 100 is operating in the first mode "HIGH", one or more of the outputs 156 from the wafer 101 can be directed to the high angle collection subsystem 155. For example, a high angle of incidence can be used. In addition, the high angle collection subsystem 155 can process the outputs 156 obtained from the wafer 101 and high angle collection subsystem 155 can provide outputs 151 to the second reflection subsystem 150, and the second reflection subsystem 150 can provide outputs 152 to the second selectable reflection subsystem 160. When the second selectable reflection subsystem 160 is operating in the first mode "HIGH" the outputs 152 from the second reflection subsystem 150 can be directed to the analyzer subsystem 170. For example, one or more blocking elements can be moved allowing the outputs 152 from the second reflection subsystem 150 to pass through the second selectable reflection subsystem 160 with a minimum amount of loss.

When the IMS 100 is operating in the second mode "LOW", one or more of the outputs 166 from the wafer 101 can be directed to the low angle collection subsystem 165. For example, a low angle of incidence can be used. In addition, the low angle collection subsystem 165 can process the outputs 166 obtained from the wafer 101 and low angle collection subsystem 165 can provide outputs 161 to the second selectable reflection subsystem 160. When the second selectable reflection subsystem 160 is operating in the second mode "LOW", the outputs 162 from the second selectable reflection subsystem 160 can be directed to the analyzer subsystem 170.

When the IMS 100 is operating in the first mode "HIGH", high incident angle data from the wafer 101 can be analyzed using the analyzer subsystem 170, and when the IMS100 is operating in the second mode "LOW", low incident angle data from the wafer 101 can be analyzed using the analyzer subsystem 170.

The IMS 100 can include one or more measurement subsystems 175 that can receive inputs from the analyzer subsystem 170. One or more of the measurement subsystems 175 can include one or more spectrometers. For example, the spectrometers can operate from the Deep-Ultra-Violet to the visible regions of the spectrum.

The IMS 100 can include one or more camera subsystems 180, one or more illumination, and imaging subsystems 185 coupled to one or more of the camera subsystems 180. In addition, the IMS 100 can also include one or more illuminator subsystems 184 that can be coupled to one or more of the imaging subsystems 185.

In some embodiments, the IMS 100 can include one or more auto-focusing subsystems 190. Alternatively, other focusing techniques may be used.

One or more of the controllers (not shown) in one or more of the subsystems (105, 110, 115, 120, 125, 130, 135, 140, 145, 150, 155, 160, 165, 170, 175, 180, 185 and 190) can be used when performing real-time or non-real-time procedures. A controller can receive real-time or non-real-time data to update subsystem, processing element, process, recipe, profile, image, pattern, and/or model data. One or more of the subsystems (105, 110, 115, 120, 125, 130, 135, 140, 145, 150, 155, 160, 165, 170, 175, 180, 185 and 190) can exchange data using one or more Semiconductor Equipment Communications Standard (SECS) messages, can read and/or remove information, can feed forward, and/or can feedback the information, and/or can send information as a SECS message.

Those skilled in the art will recognize that one or more of the subsystems (105, 110, 115, 120, 125, 130, 135, 140, 145, 150, 155, 160, 165, 170, 175, 180, 185, and 190) can include computers and memory components (not shown) as required. For example, the memory components (not shown) can be used for storing information and instructions to be executed by computers (not shown) and may be used for storing temporary variables or other intermediate information during the execution of instructions by the various computers/processors in the IMS 100. One or more of the subsystems (105, 110, 115, 120, 125, 130, 135, 140, 145, 150, 155, 160, 165, 170, 175, 180, 185, and 190) can include the means for reading data and/or instructions from a computer readable medium and can comprise the means for writing data and/or instructions to a computer readable medium. The IMS 100 can perform a portion of or all of the processing steps of the invention in response to the computers/processors in the processing system executing one or more sequences of one or more instructions contained in a memory and/or received using a computer-readable medium. Such instructions may be received from another computer, a computer readable medium, or a network connection. In addition, one or more of the subsystems (105, 110, 115, 120, 125, 130, 135, 140, 145, 150, 155, 160, 165, 170, 175, 180, 185, and 190) can comprise control applications, Graphical User Interface (GUI) components, and/or database components. For example, the control applications can include Advanced Process Control (APC) applications, Fault Detection and Classification (FDC), and/or Run-to-Run (R2R) applications. In some embodiments, APC applications, FDC applications, and/or R2R applications can be performed using multi-angle metrology procedures.

In some embodiments, the IMS 100 can include Optical Digital Profilometry (ODP) elements (not shown), and ODP elements/systems are available from Timbre Technologies Inc. (a TEL company). Alternatively, other data analysis elements may be used. For example, ODP techniques can be used to obtain real-time data that can include critical dimension (CD) data, gate structure data, thickness data, and the wavelength ranges for the ODP data can range from less than approximately 45 nm to greater than approximately 900 nm. Exemplary ODP elements can include Optical Digital Profilometry Profiler Library elements, Profiler Application Server (PAS) elements, and other ODP Profiler Software elements. The ODP Profiler Library elements can comprise application specific database elements of optical spectra and its corresponding semiconductor profiles, critical dimensions (CDs), and film thicknesses. The PAS elements can comprise at least one computer that connects with optical hardware and computer network. The PAS elements can be configured to provide the data communication, ODP library operation, results generation, results analysis, and results output. The ODP Profiler Software elements can include the software installed on PAS elements to manage measurement recipe, ODP Profiler library elements, ODP Profiler data, ODP Profiler search/match results, ODP Profiler calculation/analysis results, data communication, and PAS interface to various metrology elements and computer network.

The IMS 100 can use polarizing reflectometry, spectroscopic ellipsometry, spectroscopic reflectometry, or other optical measurement techniques to measure accurate feature profiles, accurate CDs, and multiple layer film thickness of a wafer. The integrated data process (ODP) can be executed as an integrated data analyzer in an integrated group of subsystems. In addition, the integrated group (iODP) that consists of IMS 100 and data analyzer (ODP) into a process tool eliminates the need to break the wafer for performing the analyses or waiting for long periods for data from external systems. iODP techniques can be integrated with TEL processing systems and/or lithography systems and etch systems to provide real-time process monitoring and control.

An exemplary ODP is described in U.S. Pat. No. 6,943,900, entitled GENERATION OF A LIBRARY OF PERIODIC GRATING DIFFRACTION SIGNAL, by Niu, et al., issued on Sep. 13, 2005, and is incorporated in its entirety herein by reference.

Simulated diffraction signals with ODP can be generated by applying Maxwell's equations and using a numerical analysis technique to solve Maxwell's equations. For example, various numerical analysis techniques, including variations of rigorous coupled wave analysis (RCWA), can be used with multi-layer structures. For a more detail description of RCWA, see U.S. Pat. No. 6,891,626, titled CACHING OF INTRA-LAYER CALCULATIONS FOR RAPID RIGOROUS COUPLED-WAVE ANALYSES, filed on Jan. 25, 2001, issued May 10, 2005, which is incorporated herein by reference in its entirety.

An alternative procedure for generating a library of simulated-diffraction signals can include using a machine learning system (MLS). Prior to generating the library of simulated-diffraction signals, the MLS is trained using known input and output data. For example, the MLS may be trained with a subset of the D-P library data. In one exemplary embodiment, simulated diffraction signals can be generated using a MLS employing a machine learning algorithm, such as back-propagation, radial basis function, support vector, kernel regression, and the like. For a more detailed description of machine learning systems and algorithms, see "U.S. patent application Ser. No. 10/608,300, titled OPTICAL METROLOGY OF STRUCTURES FORMED ON SEMICONDUCTOR WAFERS USING MACHINE LEARNING SYSTEMS, filed on Jun. 27, 2003, which is incorporated herein by reference in its entirety.

In various embodiments, one or more of the subsystems (105, 110, 115, 120, 125, 130, 135, 140, 145, 150, 155, 160, 165, 170, 175, 180, 185, and 190) can perform evaluation procedures, inspection procedures, temperature control procedures, measurement procedures, alignment procedures, verification procedures, and/or storage procedures on one or more wafers. For example, wafer data that can include wafer temperature, wafer thickness, wafer curvature, layer thickness, wafer uniformity, pattern data, damage data, or particle data, or any combination thereof. In addition, controller 195 can determine if the wafer has been processed correctly or if a rework procedure is required.

Figure 2:
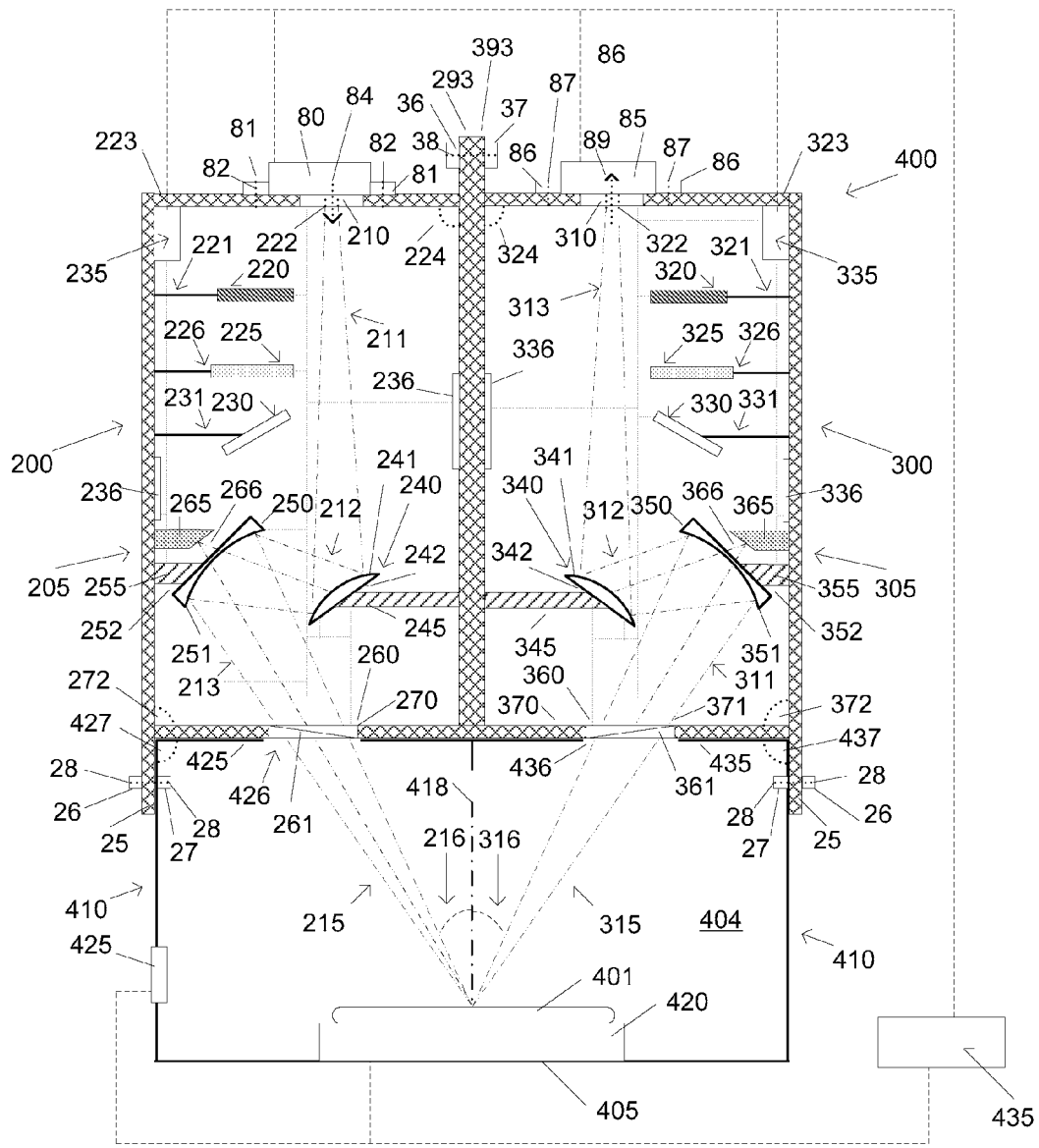
FIG. 2 illustrates a simplified block diagram of a Metrology Assembly and a simplified block diagram of a test subsystem in accordance with embodiments of the invention.

FIG. 2 illustrates a simplified block diagram of a Multi-Angle Assembly and a simplified block diagram of a test subsystem in accordance with embodiments of the invention. In the illustrated embodiment, a Metrology Assembly 400 is shown that includes a first set of source elements 200 and a first set of receiving elements 300. In some examples, the source elements 200 can include one or more focusing elements, and the receiving elements 300 can include one or more collecting elements. Alternatively, other source elements and/or receiving elements may be used. The Metrology Assembly 400 is shown coupled to a test chamber 410 using one or more attachment elements 25, one or more attachment devices (26 and 27) and one or more alignment devices 28. For example, first pre-aligned output wall 270 and second pre-aligned input wall 370 in the Metrology Assembly 400 can be coupled to the first alignment wall 425 and the second alignment wall 435 in the test chamber 410. Alternatively, other configurations may be used.

The source elements 200 can include a source chamber 205 having one or more attachment elements 25. The source chamber 205 can be a sealable structure that can be evacuated and back-filled with a low-pressure gas, such as nitrogen. Alternatively, a back-filling procedure may not be required.

The source elements 200 can include a first input optical element 210 that can include an illumination pinhole 222, and the first input optical element 210 can be mounted and aligned in a first pre-aligned input wall 223 having a pre-aligned angle 224. For example, the illumination pinhole 222 can include material that is optically transparent to a first set of wavelengths. In alternate embodiments, the first input optical element may include a lens or a polarizer. The pre-aligned angle 224 can vary from approximately 85 degrees to approximately 95 degrees. A preferred value can be 90.0 degrees. The first input optical element 210 can be configured for coupling to optical windows or optical fibers.

The source elements 200 can include a movable shutter element 220 and an attachment element 221. For example, the movable shutter element 220 can be moved to intercept and turn-off one or more of the internal source beams (211, 212, and 213) that can be aligned or non-aligned. Alternatively, the movable shutter element 220 may not required. The attachment element 221 can comprise one or more coupling elements and can be coupled to an inside wall of the source chamber 205. The movable shutter element 220 and an attachment element 221 can be coupled to a controller 235. In an alternate embodiment, the movable shutter element 220 may include a polarizing element.

The source elements 200 can include a moveable ultra-violet (UV) cutoff filter 225 and an attachment element 226. For example, the movable ultra-violet cutoff filter 225 can be moved to intercept and remove the UV wavelengths from one or more of the internal source beams (211, 212, and 213) that can be aligned or non-aligned. Alternatively, the movable ultra-violet cutoff filter 225 may not required. The attachment element 226 can comprise one or more coupling elements and can be coupled to an inside wall of the source chamber 205. The movable ultra-violet cutoff filter 225 and an attachment element 226 can be coupled to a controller 235. In an alternate embodiment, the movable ultra-violet cutoff filter 225 may include a different filter element.

The source elements 200 can include a moveable measurement device 230 and an attachment element 231. For example, the movable measurement device 230 can be moved to intercept and measure one or more of the internal source beams (211, 212, and 213) that can be aligned or non-aligned. Alternatively, the movable measurement device 230 may not be required. The attachment element 231 can comprise one or more coupling elements and can be coupled to an inside wall of the source chamber 205. The movable measurement device 230 and the attachment element 231 can be coupled to a controller 235.

In addition, the source elements 200 can include one or more fixed measurement devices 236 that can be used to measure residual light in the source chamber 205. The fixed measurement devices 236 can be coupled to the controller 235, and can be positioned to measure misaligned beams. Alternatively, the fixed measurement devices may not be required.

The source elements 200 can comprise a first reflecting element 240 that can include one or more first highly-efficient reflecting surfaces 241 that can be used as an illumination aperture stop. The first reflecting element 240 can be coupled to a first adjusting structure 245 and the first adjusting structure 245 can position the first reflecting element 240 at a first angle 242. The first highly-efficient reflecting surfaces 241 can include one or more convex surfaces that can receive the first aligned internal source beam 211 and create a second aligned internal source beam 212. The first highly-efficient reflecting surfaces 241 can include one or more highly polished surfaces. The first reflecting element 240 and/or the first adjusting structure 245 can be coupled to a controller 235.

In some examples, the first adjusting structure 245 can include mechanical adjustment devices (not shown), and mechanical adjustments can be made to change the first angle 242 during the alignment and/or testing procedures before the source chamber 205 is sealed. In other examples, the first adjusting structure 245 can include electronic adjustment devices (not shown), and electronic adjustments can be made before and after the source chamber 205 is sealed. Electronic adjustments can be made to change the first angle 242 during system operations, and the controller 235 can be programmed to change the first angle 242 in order to compensate for drift and/or system variations. In addition, when a new light source is installed, the controller 235 can be programmed to compensate for the lamp-to-lamp variations and a system level alignment may not be required. The first angle 242 can vary from approximately 45 degrees to approximately 80 degrees.

The source elements 200 can comprise a second reflecting element 250 that can include one or more second highly-efficient reflecting surfaces 251 that can be used as a focusing element. The second reflecting element 250 can be coupled to a second adjusting structure 255 and the second adjusting structure 255 can position the second reflecting element 250 at a second angle 252. The second highly-efficient reflecting surfaces 251 can include one or more concave surfaces that can receive the second aligned internal source beam 212 and create a third aligned internal source beam 213. The second highly-efficient reflecting surfaces 251 can include one or more highly polished surfaces. The second reflecting element 250 and/or the second adjusting structure 255 can be coupled to a controller 235.

In some examples, the second adjusting structure 255 can include mechanical adjustment devices (not shown), and mechanical adjustments can be made to change the second angle 252 during the alignment and/or testing procedures before the source chamber 205 is sealed. In other examples, the second adjusting structure 255 can include electronic adjustment devices (not shown), and electronic adjustments can be made before and/or after the source chamber 205 is sealed. Electronic adjustments can be made to change the second angle 252 during system operations, and the controller 235 can be programmed to change the second angle 252 in order to compensate for drift and/or system variations. In addition, when a new light source is installed, the controller 235 can be programmed to compensate for the lamp-to-lamp variations and a system level alignment may not be required. The second angle 252 can vary from approximately 45 degrees to approximately 80 degrees.

The source elements 200 can comprise a reference detector 265 that can be used to measure a reference beam 266. The reference detector 265 can be coupled to an inside wall of the source chamber 205, and the reference detector 265 can be coupled to a controller 235. During some alignment and test procedures, the optical test source 80 can be programmed to provide one or more reference beams 266.

The source elements 200 can comprise a first output optical element 260 that can include one or more low-loss polarizing components 261. The first output optical element 260 can be mounted and aligned in a first opening 271 in a first pre-aligned output wall 270 that can be configured for attaching the first Metrology Assembly 400 to the test chamber 410 or to an IMS 100, such as shown in FIG. 1. Alternatively, the polarizing components may not be required. The first output optical element 260 can include one or more low-loss polarizing components 261 that can be used to receive the third aligned internal source beam 213 and create a first incident beam 215 having a first incident angle 216. The first incident angle 216 can measured relative to a normal vector 418 and can vary from approximately 15 degrees to approximately 80 degrees. The first output optical element 260 can be coupled to a controller 235 when the first output optical element 260 includes adjustable components, such as a polarizer. The first output optical element 260 can be configured for coupling to optical windows or optical fibers.

In some examples, the low-loss polarizing components 261 that can linearly polarize the light, and the polarization can be selected to maximize the sensitivity of the optical measurement to the parameters of the sample. One or more of the polarizing components 261 can provide the S-polarized light. In other examples, polarizing components 261 may be rotated to collect additional measurement data. Alternatively, a rotating waveplate or electro-optic modulator (Pockels or Kerr effect based) could be placed after polarizing components 261 to collect more information on the sample's properties.

After a Metrology assembly 400 has been constructed or repaired, one or more pre-alignment procedures can be used to align and/or test the non-aligned assembly to create a pre-aligned assembly.

During some alignment procedures, an optical test source 80 can be coupled to the source chamber 205 using one or more first coupling elements 81 that can include alignment devices 82. For example, one or more alignment lasers may be used during alignment and replaced by fastening means after alignment. The optical test source 80 can operate at many different wavelengths and can provide one or more optical test signals 84 that have different polarization angles. The illumination pinhole 222 can be used to establish a first aligned internal source beam 211 using a source signal from the optical test source 80. In various procedures, the movable shutter element 220 can be aligned and tested; the moveable ultra-violet cutoff filter 225 can be aligned and tested, and the moveable measurement device 230 can be used to measure and/or align the first aligned internal source beam 211. The first reflecting element 240 can be adjusted to align and/or optimize the second aligned internal source beam 212, the second reflecting element 250 can be adjusted to align and/or optimize the third aligned internal source beam 213, and the first output optical element 260 can be adjusted to align and/or optimize the first incident beam 215.

In some embodiments, the test subsystem 410 can include one or more motion control subsystems 420, and the motion control subsystem 420 can be removably coupled at various times and in various places to a test subsystem. In addition, the test chamber 410 can include a process space 404 that can be evacuated during testing and alignment procedures. Alternatively, multiple process spaces may be used.

The source chamber 205 can be coupled to the test chamber 410. For example, the source chamber 205 can comprise a first pre-aligned output wall 270 that can be coupled to and aligned with a first alignment wall 425 in the test chamber 410. The first pre-aligned output wall 270 in the source chamber 205 can have a first pre-aligned angle 272, the first alignment wall 425 in the test chamber 410 can have a first alignment angle 427, and the first pre-aligned angle 272 can be substantially equal to the first alignment angle 427. For example, the first pre-aligned angle 272 and the first alignment angle 427 can vary from approximately 40 degrees to approximately 90 degrees.

In addition, the first wall 425 in the test chamber 410 can include a first opening 426 that can be aligned with the first opening 271 in the first pre-aligned output wall 270 in the source chamber 205 and can be used to allow the first incident beam 215 to enter the test chamber 410. In some configurations, an optically transparent window (not shown) can be installed in the first opening 426. The first incident angle 216 can vary from approximately 15 degrees to approximately 50 degrees relative to a normal vector 418. In this manner, the first incident angle 216 that is established during the alignment and testing procedures remains correct when the Metrology Assembly 400 is installed in an IMS 100, such as shown in FIG. 1.

During some alignment procedures, measurement data can be obtained for the source elements 200 using various test wafers 401 in the test chamber 410. The measurement data for the source elements 200 can include intensity data, wavelength data, incident angle data, polarization data, transmission data, reflection data, and diffraction data. Alternatively, other measurement devices (not shown) may be used to simulate a wafer.

In some embodiments, the receiving elements 300 can include a receiver chamber 305 having one or more attachment elements 25. The receiver chamber 305 can be a sealable structure that can be evacuated and back-filled with a low-pressure gas, such as nitrogen. Alternatively, a back-filling may not be required.

The receiving elements 300 can comprise a second input optical element 360 that can include one or more low-loss polarizing components 361. The second input optical element 360 can be mounted and aligned in a second opening 371 in a second pre-aligned input wall 370 that is configured for attaching the Metrology Assembly 400 to the test chamber 410 or to an IMS (100, FIG. 1). Alternatively, the polarizing components may not be required. The second input optical element 360 can include one or more low-loss polarizing components 361 that can be used to receive the first reflection beam 315 having a first reflection angle 316 and create a first aligned internal received beam 311. The first reflection angle 316 can measured relative to a normal vector 418 and can vary from approximately 45 degrees to approximately 80 degrees. The second input optical element 360 can be coupled to a controller 335 when the second input optical element 360 includes adjustable components, such as a polarizer. The second input optical element 360 can be configured for coupling to optical windows or optical fibers.

In addition, the receiving elements 300 can comprise a first reflecting element 350 that can include one or more third highly-efficient reflecting surfaces 351 that can be used as a collecting element. The first reflecting element 350 can be coupled to a first adjusting structure 355 and the first adjusting structure 355 can position the first reflecting element 350 at a first angle 352. The third highly-efficient reflecting surfaces 351 can include one or more concave surfaces that can receive the first aligned internal received beam 311 and create a second aligned internal received beam 312. The third highly-efficient reflecting surfaces 351 can include one or more highly polished surfaces. The first reflecting element 350 and/or the first adjusting structure 355 can be coupled to a controller 335.

In some examples, the first adjusting structure 355 can include mechanical adjustment devices (not shown), and mechanical adjustments can be made to change the first angle 352 during the alignment and/or testing procedures before the receiver chamber 305 is sealed. In other examples, the first adjusting structure 355 can include electronic adjustment devices (not shown), and electronic adjustments can be made before the receiver chamber 305 is sealed and after the receiver chamber 305 is sealed. Electronic adjustments can be made to change the first angle 352 during system operations, and the controller 335 can be programmed to change the first angle 352 in order to compensate for drift and/or system variations. In addition, when a new light source is installed, the controller 335 can be programmed to compensate for the lamp-to-lamp variations and a system level alignment may not be required. The first angle 352 can vary from approximately 45 degrees to approximately 80 degrees.

The receiving elements 300 can comprise a reference detector 365 that can be used to measure a reference beam 366. The reference detector 365 can be coupled to an inside wall of the receiver chamber 305, and the reference detector 365 can be coupled to a controller 335. During some alignment and test procedures, the optical test source 80 can be programmed to provide one or more reference beams 366.

The receiving elements 300 can comprise a second reflecting element 340 that can include one or more fourth highly-efficient reflecting surfaces 341 that can be used as an illumination aperture stop. The second reflecting element 340 can be coupled to a second adjusting structure 345 and the second adjusting structure 345 can position the second reflecting element 340 at a second angle 342. The fourth highly-efficient reflecting surfaces 341 can include one or more convex surfaces that can receive a second aligned internal received beam 312 and create a first aligned internal received beam 311. The fourth highly-efficient reflecting surfaces 341 can include one or more highly polished surfaces. The second reflecting element 340 and/or the second adjusting structure 345 can be coupled to a controller 335.

In some examples, the second adjusting structure 345 can include mechanical adjustment devices (not shown), and mechanical adjustments can be made to change the second angle 342 during the alignment and/or testing procedures before the receiver chamber 305 is sealed. In other examples, the second adjusting structure 345 can include electronic adjustment devices (not shown), and electronic adjustments can be made before and/or after the receiver chamber 305 is sealed. Electronic adjustments can be made to change the second angle 342 during system operations, and the controller 335 can be programmed to change the second angle 342 in order to compensate for drift and/or system variations. In addition, when a new light source is installed, the controller 335 can be programmed to compensate for the lamp-to-lamp variations and a system level alignment may not be required. The second angle 342 can vary from approximately 45 degrees to approximately 80 degrees.

The receiving elements 300 can include a second output optical element 310 that can include an output pinhole 322 that is configured to establish a measurement beam 89, and the second output optical element 310 can be coupled to a second pre-aligned output wall 323 having a pre-aligned angle 324. For example, the output pinhole 322 can include material that is optically transparent to a first set of wavelengths, and the pre-aligned angle 324 can vary from approximately 85 degrees to approximately 95 degrees. A preferred value can be 90.0 degrees. In addition, the output pinhole 322 can be larger than the illumination pinhole 222.

In other embodiments, the receiving elements 300 can include a moveable measurement device 330 and an attachment element 331. For example, the movable measurement device 330 can be moved to intercept and measure one or more of the internal received beams (311, 312, and 313) that can be aligned or non-aligned. Alternatively, the movable measurement device 330 may not be required. The attachment element 331 can comprise one or more coupling elements and can be coupled to an inside wall of the receiver chamber 305. The movable measurement device 330 and the attachment element 331 can be coupled to a controller 335. In addition, the receiving elements 300 can include one or more fixed measurement devices 336 that can be used to measure residual light in the receiver chamber 305. The fixed measurement devices 336 can be coupled to the controller 335, and can be positioned to measure misaligned beams or internal light intensity. Alternatively, the fixed measurement devices may not be required.

In other examples, the receiving elements 300 can include a moveable ultra-violet UV cutoff filter 325 and an attachment element 326. For example, the movable ultra-violet UV cutoff filter 325 can be moved to intercept and remove the UV wavelengths from one or more of the internal received beams (311, 312, and 313) that can be aligned or non-aligned. Alternatively, the movable ultra-violet UV cutoff filter 325 may not required. The attachment element 326 can comprise one or more coupling elements and can be coupled to an inside wall of the receiver chamber 305. The movable ultra-violet UV cutoff filter 325 and an attachment element 326 can be coupled to a controller 335. In an alternate embodiment, the movable ultra-violet UV cutoff filter 325 may include a different filter element.

In still other example, the receiving elements 300 can include a movable shutter element 320 and an attachment element 321. For example, the movable shutter element 320 can be moved to intercept and turn-off one or more of the internal received beams (311, 312, and 313) that can be aligned or non-aligned. Alternatively, the movable shutter element 320 may not be required. The attachment element 321 can comprise one or more coupling elements and can be coupled to an inside wall of the receiver chamber 305. The movable shutter element 320 and an attachment element 321 can be coupled to a controller 335. In an alternate embodiment, the movable shutter element 320 may include a polarizing element.

After the Metrology Assembly 400 has been constructed or repaired, one or more alignment procedures can be used to align and/or test a non-aligned assembly to create a Pre-Aligned Assembly.

During some pre-alignment procedures, a measurement subsystem 85 can be coupled to the receiver chamber 305 using one or more second coupling elements 86 that can include alignment devices 87. For example, one or more alignment lasers may be used during alignment and replaced by fastening means after alignment. The output pinhole 322 can be used to create a measurement beam 89 using the third aligned internal received beam 313. The measurement subsystem 85 can be used to measure the measurement beam 89. The measurement subsystem 85 can include a number of different devices that can be coupled to the receiver chamber 305 during various measurement procedures. The measurement subsystem 85 can operate over a wavelength range from approximately 190 nm to approximately 1000 nm and a polarization angle range from zero degrees to three-hundred-sixty degrees. For example, the measurement subsystem 85 can include one or more spectrometers, and the spectrometers can operate from the Deep-Ultra-Violet to the visible regions of the spectrum.

In various procedures, the movable shutter element 320 can be aligned and tested; the moveable ultra-violet UV cutoff filter 325 can be aligned and tested, and the moveable measurement device 330 can be used to measure and/or align the third aligned internal received beam 313. The second input optical element 360 can be adjusted to align and/or optimize the first aligned internal received beam 311, the first reflecting element 350 can be adjusted to align and/or optimize the second aligned internal received beam 312, and the second reflecting element 340 can be adjusted to align and/or optimize the third aligned internal received beam 313.

In addition, the second alignment wall 435 in the test chamber 410 can include a second opening 436 that can be aligned with the second opening 371 in the second pre-aligned input wall 370 and can be used to allow the reflection beam 315 to pass through and exit the test chamber 410. In some configurations, an optically transparent window (not shown) can be installed in the second opening 436 in the test chamber 410. The first reflection angle 316 can vary from approximately 15 degrees to approximately 50 degrees relative to the normal vector 418.

FIG. 3 illustrates an exemplary flow diagram of an alignment procedure for a Metrology Assembly in accordance with embodiments of the invention. For example, the alignment procedure for a Metrology Assembly 400 can be performed using pre-aligned test fixture and a non-aligned assembly.

In 510, a Metrology Assembly 400 can be coupled to a test chamber 410 using one or more attachment elements 25, one or more attachment devices (26 and 27) and one or more alignment devices 28. A first pre-aligned output wall 270 and a second pre-aligned input wall 370 in the Metrology Assembly 400 can be aligned with and coupled to a first alignment wall 425 and a second alignment wall 435 in the test chamber 410. The first pre-aligned output wall 270 can have a first pre-aligned angle 272, and the first alignment wall 425 can have a first alignment angle 427 that is substantially equal to the first pre-aligned angle 272. The second pre-aligned input wall 370 can have a second pre-aligned angle 372, and the second alignment wall 435 can have a second alignment angle 437 that is substantially equal to the second pre-aligned angle 372.

In 515, an optical test source 80 can be coupled to the first pre-aligned input wall 223 in the source chamber 205 using one or more first coupling elements 81 and one or more alignment devices 82. The first pre-aligned input wall 223 can include a first input optical element 210 having an illumination pinhole 222.

In 520, a first measurement subsystem 85 can be coupled to the second pre-aligned output wall 323 in the receiver chamber 305 using one or more second coupling elements 86 and one or more alignment devices 87. The second pre-aligned output wall 323 can include a second output optical element 310 having an output pinhole 322.

In 525, a first incident beam 215 can be established using the source elements 200. In some examples, a first aligned internal source beam 211 can be established in the source chamber 205, and the optical test source 80 can provide a test signal having a first wavelength and a first polarization angle. For example, the optical test source 80, the first pre-aligned input wall 223, and the illumination pinhole 222 can be configured to operate using a first set of wavelengths that can vary from approximately 190 nm to approximately 1000 nm. Then, a second aligned internal source beam 212 can be established in the source chamber 205. A first highly-efficient reflecting surface 241 can be movably mounted to a first adjusting structure 245 that is rigidly coupled a first chamber wall, and the first adjusting structure can be configured to position the first highly-efficient reflecting surface 241 at a first angle 242 to receive the first aligned internal source beam 211 and to establish the second aligned internal source beam 212. Next, a third aligned internal source beam 213 can be established in the source chamber 205. A second highly-efficient reflecting surface 251 can be movably mounted to a second adjusting structure 255 that is rigidly coupled a second chamber wall, and the second adjusting structure can be configured to position the second highly-efficient reflecting surface 251 at a second angle 252 to receive the second aligned internal source beam 212 and to establish the third aligned internal source beam 213. Lastly, the third aligned internal source beam 213 is sent through a first output optical element 260 that can include a polarizer, and the first incident beam 215 can be established.

In 530, the first incident beam 215 can be directed to a test wafer 401 in a test chamber 410 and a first reflection beam 315 can be sent from the test wafer 401 in a test chamber 410. The first incident beam 215 and the reflection beam 315 can be aligned using wavelengths between approximately 190 nm and approximately 900 nm, and polarization angles from zero degrees to three-hundred sixty degrees.

In 535, the first reflection beam 315 can be processed using one or more of the receiving elements 300. A first aligned internal received beam 311 can be established in the receiver chamber 305, and a second input optical element 360 can be configured to convert the reflection beam 315 into the first aligned internal received beam 311. For example, the second input optical element 360 can comprise a polarizer. Next, a second aligned internal received beam 312 can be established in the receiver chamber 305. A third highly-efficient reflecting surface 351 can be movably mounted to a first adjusting structure 355 that is rigidly coupled a first chamber wall, and the first adjusting structure can be configured to position the third highly-efficient reflecting surface 351 at a first angle 352 to receive the first aligned internal received beam 311 and to establish the second aligned internal received beam 312. Then, a third aligned internal received beam 313 can be established in the receiver chamber 305. A fourth highly-efficient reflecting surface 341 can be movably mounted to a second adjusting structure 345 that is rigidly coupled a second chamber wall, and the second adjusting structure can be configured to position the fourth highly-efficient reflecting surface 341 at a second angle 342 to receive the second aligned internal received beam 312 and to establish the third aligned internal received beam 313. Lastly, a measurement beam 89 can be established using a second output optical element 310 that can include an output pinhole 322 that is configured to establish the measurement beam 89.

In 540, measurement data can be obtained for the measurement beam 89 using the first measurement subsystem 85. The measurement data can be used to determine the alignment error associated with the first incident beam 215 and the first reflection beam 315.

In 545, a query can be performed to determine if the alignment error is less than a first alignment error limit. When the alignment error is less than a first alignment error limit, procedure 500 can branch to 550. When the alignment error is not less than a first alignment error limit, procedure 500 can branch to 555.

In 550, the Metrology Assembly 400 can be identified as a "Pre-Aligned Metrology Assembly".

In 555, one or more corrective actions can be performed.

Data can be sent from and/or received by the Pre-Aligned Metrology Assembly, and data can be passed to the Pre-Aligned Metrology Assembly in real-time as real-time variable parameters, overriding current recipe or model default values, improving the alignment time for the tool, and improving the measurement accuracy. The Pre-Aligned Metrology Assembly can be used with a library-based system, or regression-based system, or any combination thereof.

Reliability, availability, throughput, and performance are the most important parameters for semiconductor equipments. Typically, most of the optical metrology systems for thin-film and CD measurement are performed using stand-alone equipment and off-line applications for process monitor. As the semiconductor roadmap goes to smaller and smaller nodes, the tightened tolerances provide additional challenges on semiconductor process control. Pre-Aligned Optical Metrology Systems that are designed using Pre-Aligned Metrology Assemblies and Pre-Aligned Optical Metrology Modules can be used to more accurately measure the smaller structures created on the wafer, and use the measured data either for optimize the process tools that the structures on the wafer has been made, or for adjust the process tool conditions that the wafer is going to be further processed. This is true especially for the incident angle 216 determination. In prior art, the angle 216 is determined with fitting the measurement data with all other system parameters. As the results of correlation between different parameters, the uncertainty of the data fitting process is large, and thus the whole system measurement uncertainty is large and it is very difficulty to meet the requirement of current and further applications. For this invention, the incident angle 216 is pre-determined when the module is aligned, and a test fixture can be used to measure the incident angle during alignment. In this way, the incident angle 216 is determined independent of other system parameters, and the uncertainty is very small, thus the whole system has much higher measurement accuracy.

Pre-Aligned Metrology Assemblies and Pre-Aligned Optical Metrology Modules can be used to improve tool reliability, to reduce the time to repair, and to provide improved tool availability. Pre-Aligned Metrology Assemblies and Pre-Aligned Optical Metrology Modules can easily be integrated when new equipment is designed. Each one of the Pre-Aligned Metrology Assemblies and/or Pre-Aligned Optical Metrology Modules can be assembled, aligned, calibrated, and swapped each other with a minimum amount of system level adjustment.

Those skilled in the art will recognize that one or more of the controllers (235, 335, and 435) can include microprocessors and memory components (not shown) as required. For example, the memory components (not shown) can be used for storing information and instructions to be executed by microprocessors (not shown) and may be used for storing temporary variables or other intermediate information during the execution of instructions by the various computers/processors. One or more of the controllers (235, 335, and 435) can include the means for reading data and/or instructions from a computer readable medium and can comprise the means for writing data and/or instructions to a computer readable medium. The controllers (235, 335, and 435) can perform a portion of or all of the processing steps of the invention in response to the computers/processors executing one or more sequences of one or more instructions contained in a memory and/or received using a computer-readable medium. Such instructions may be received from another computer, a computer readable medium, or a network connection. For example, one or more of the controllers (235, 335, and 435) can perform Advanced Process Control (APC) applications, Fault Detection and Classification (FDC) applications, Run-to-Run (R2R) applications, D-P procedures, D-E procedures, and/or library procedures.

For example, the attachment elements and the alignment devices can be configured to allow the Pre-Aligned Metrology Modules and Subsystems to be quickly coupled to and/or decoupled from one or more test benches used for testing and/or aligning.

Preventive maintenance procedures can be established for the Pre-Aligned Metrology Modules, and the preventive maintenance procedure can be based on the expected lifetime for one or more of the components.

In some embodiments, the Pre-Aligned Metrology Assembly can include integrated Optical Digital Profilometry (iODP) elements (not shown), and iODP elements/systems are available from Timbre Technologies Inc. (a TEL company). Alternatively, other metrology systems may be used.

The Pre-Aligned Metrology Assembly can use polarizing reflectometry, spectroscopic ellipsometry, spectroscopic reflectometry, or other optical measurement techniques to measure accurate device profiles, accurate CDs, and multiple layer film thickness of a wafer. The integrated metrology process (iODP) can be executed as an integrated process in an integrated group of subsystems. In addition, the integrated process eliminates the need to break the wafer for performing the analyses or waiting for long periods for data from external systems. iODP techniques can be used with the existing IMS for inline profile and critical dimension (CD) measurement, and can be integrated with TEL processing systems and/or lithography systems to provide real-time process monitoring and control.

Data from the Pre-Aligned Metrology Assembly can include measured, predicted, and/or simulated data, and the data can be stored using processing, wafer, lot, recipe, site, or wafer location data. In some cases, one or more "golden" assemblies and/or modules can be used in verification procedures.

Although only certain embodiments of this invention have been described in detail above, those skilled in the art will readily appreciate that many modifications are possible in the embodiments without materially departing from the novel teachings and advantages of this invention. Accordingly, all such modifications are intended to be included within the scope of this invention.

Thus, the description is not intended to limit the invention and the configuration, operation, and behavior of the present invention has been described with the understanding that modifications and variations of the embodiments are possible, given the level of detail present herein. Accordingly, the preceding detailed description is not mean or intended to, in any way, limit the invention - rather the scope of the invention is defined by the appended claims.

What is claimed:

1. A method for aligning a Metrology Assembly comprising:

coupling a non-aligned Metrology Assembly to a test chamber, wherein a first pre-aligned output wall of a source chamber is coupled to a first alignment wall of the test chamber and a second pre-aligned input wall of a receiver chamber is coupled to a second alignment wall of the test chamber, wherein the first pre-aligned output wall has a first pre-aligned angle, and the first alignment wall has a first alignment angle substantially equal to the first pre-aligned angle, the second pre-aligned input wall having a second pre-aligned angle, the second alignment wall having a second alignment angle substantially equal to the second pre-aligned angle;

coupling a optical test source to a first pre-aligned input wall of the source chamber using one or more first coupling elements and one or more first alignment devices, the first pre-aligned input wall comprising a first input optical element having an illumination pinhole;

establishing one or more aligned internal source beams in the source chamber using a test beam from the optical test source;

establishing a test incident beam, wherein a first output optical element is mounted and aligned in the first pre-aligned output wall of the source chamber and is configured to receive at least one aligned internal source beam and to establish the test incident beam;

establishing a test reflection beam using the test incident beam and a test wafer in the test chamber;

establishing one or more aligned internal received beams in the receiver chamber, wherein a second input optical element is mounted and aligned in the second pre-aligned input wall of the receiver chamber and is configured to receive the test incident beam and to establish at least one aligned internal received beam;

establishing a measurement beam from the receiver chamber, wherein a second output optical element is mounted and aligned in a second pre-aligned output wall of the receiver chamber, the second output optical element having an output pinhole configured to establish the measurement beam using at least one aligned internal received beam;

obtaining measurement data for the Metrology Assembly using the measurement beam and a measurement subsystem, the measurement subsystem being coupled to the second pre-aligned output wall of the receiver chamber using one or more second coupling elements and one or more second alignment devices;

determining an alignment error between the test incident beam and the test reflection beam;

identifying the test incident beam and the test reflection beam as pre-aligned beams and identifying the non-aligned Metrology Assembly as a Pre-Aligned Metrology Assembly when the alignment error is less than a first error limit; and performing a corrective action when the alignment error is not less than the first error limit.

2. The method of claim 1 wherein the establishing one or more aligned internal source beams further comprises:

aligning a first internal source beam in the source chamber, the optical test source providing a first optical test signal having a first set of operating wavelengths and having a first polarization angle, wherein the optical test source, the first pre-aligned input wall, and the illumination pinhole are configured to align the first internal source beam using the first set of operating wavelengths;

aligning a second internal source beam in the source chamber, wherein a first highly-efficient reflecting surface is coupled to the source chamber and is positioned at a first angle to receive the aligned first internal source beam and to align the second internal source beam;

aligning a third internal source beam in the source chamber, wherein a second highly-efficient reflecting surface is coupled to the source chamber and is positioned at a second angle to receive the aligned second internal source beam and to establish the third internal source beam; and establishing the test incident beam, wherein the first output optical element is positioned at a third angle to receive the aligned third internal source beam and to establish a first incident angle for the test incident beam.

3. The method of claim 2, wherein the corrective action comprises:

establishing a new alignment error by re-aligning the illumination pinhole, the first highly-efficient reflecting surface, the second highly-efficient reflecting surface, or the first output optical element, or a combination thereof, when the alignment error exceeds the first error limit;

identifying the non-aligned Metrology Assembly as a new Pre-Aligned Metrology Assembly when the new alignment error does not exceed a new error limit; and performing a new corrective action when the new alignment error does exceed the new error limit.

4. The method of claim 2, wherein the corrective action comprises:
  establishing a new alignment error by repairing the illumination pinhole, the first highly-efficient reflecting surface, the second highly-efficient reflecting surface, or the first output optical element, or a combination thereof, when the alignment error exceeds the first error limit;
  identifying the non-aligned Metrology Assembly as a new Pre-Aligned Metrology Assembly when the new alignment error does not exceed a new error limit; and
  performing a new corrective action when the new alignment error does exceed the new error limit.

5. The method of claim 2, wherein the corrective action comprises:
  establishing a new alignment error by replacing the illumination pinhole, the first highly-efficient reflecting surface, the second highly-efficient reflecting surface, or the first output optical element, or a combination thereof, when the alignment error exceeds the first error limit;
  identifying the non-aligned Metrology Assembly as a new Pre-Aligned Metrology Assembly when the new alignment error does not exceed a new error limit; and
  performing a new corrective action when the new alignment error does exceed the new error limit.

6. The method of claim 1, wherein the establishing one or more aligned internal received beams further comprises:
  aligning a first internal received beam in the receiver chamber, wherein the second input optical element is mounted in a second pre-aligned wall of the receiver chamber and is configured to convert the test reflection beam into a first aligned internal received beam;
  aligning a second internal received beam in the receiver chamber, wherein a first highly-efficient collecting surface is positioned a first angle to receive the first aligned internal received beam and to establish a second aligned internal received beam;
  aligning a third internal received beam in the receiver chamber, wherein a second highly-efficient collecting surface is positioned at a second angle to receive the second aligned internal received beam and to establish a third aligned internal received beam;
  establishing the measurement beam from the receiver chamber, wherein the second output optical element is mounted and aligned in the second pre-aligned output wall of the receiver chamber, the second output optical element having the output pinhole configured to establish the measurement beam using the third aligned internal received beam.

7. The method of claim 6, wherein the corrective action comprises:
  establishing a new alignment error by re-aligning the second input optical element, the first highly-efficient collecting surface, the second highly-efficient collecting surface, or the second output optical element, or a combination thereof, when the alignment error exceeds the first error limit;
  identifying the non-aligned Metrology Assembly as a new Pre-Aligned Metrology Assembly when the new alignment error does not exceed a new error limit; and
  performing a new corrective action when the new alignment error does exceed the new error limit.

8. The method of claim 6, wherein the corrective action comprises:
  establishing a new alignment error by repairing the second input optical element, the first highly-efficient collecting surface, the second highly-efficient collecting surface, or the second output optical element, or a combination thereof, when the alignment error exceeds the first error limit;
  identifying the non-aligned Metrology Assembly as a new Pre-Aligned Metrology Assembly when the new alignment error does not exceed a new error limit; and
  performing a new corrective action when the new alignment error does exceed the new error limit.

9. The method of claim 6, wherein the corrective action comprises:
  establishing a new alignment error by replacing the second input optical element, the first highly-efficient collecting surface, the second highly-efficient collecting surface, or the second output optical element, or a combination thereof, when the alignment error exceeds the first error limit;
  identifying the non-aligned Metrology Assembly as a new Pre-Aligned Metrology Assembly when the new alignment error does not exceed a new error limit; and
  performing a new corrective action when the new alignment error does exceed the new error limit.

10. The method of claim 1, wherein the corrective action comprises:
  establishing a new alignment error by changing a wavelength associated with the optical test source, when the alignment error exceeds the first error limit;
  identifying the non-aligned Metrology Assembly as a new Pre-Aligned Metrology Assembly when the new alignment error does not exceed a new error limit; and
  performing a new corrective action when the new alignment error does exceed the new error limit.

11. The method of claim 1, wherein the corrective action comprises:
  establishing a new alignment error by changing a polarization angle associated with the optical test source, when the alignment error exceeds the first error limit;
  identifying the non-aligned Metrology Assembly as a new Pre-Aligned Metrology Assembly when the new alignment error does not exceed a new error limit; and
  performing a new corrective action when the new alignment error does exceed the new error limit.

12. The method of claim 1 wherein the establishing one or more aligned internal source beams further comprises:
  establishing a first aligned internal source beam in the source chamber, the optical test source providing a test signal having a first set of operating wavelengths and having a first polarization angle, wherein the optical test source, the first pre-aligned input wall, and the illumination pinhole are configured to establish the first aligned internal source beam using the first set of operating wavelengths;
  establishing a second aligned internal source beam in the source chamber, wherein a first highly-efficient reflecting surface is movably mounted to a first adjusting structure rigidly coupled a first chamber wall, the first adjusting structure being configured to position the first highly-efficient reflecting surface at a first angle to receive the first aligned internal source beam and to establish the second aligned internal source beam;
  establishing a third aligned internal source beam in the source chamber, wherein a second highly-efficient reflecting surface is movably mounted to a second adjusting structure that is rigidly coupled a second chamber wall, the second adjusting structure being configured to position the second highly-efficient reflecting surface at a second angle to receive the second aligned internal source beam and to establish the third aligned internal source beam; and
establishing the test incident beam, wherein an output optical coupling element is mounted in a first pre-aligned wall of the source chamber and is positioned at a third angle to receive the third aligned internal source beam and to establish the test incident beam.

13. The method of claim 1 wherein the establishing one or more pre-aligned collecting beams further comprises:
establishing a first aligned internal received beam in the receiver chamber using the second input optical element configured to convert the test reflection beam into the first aligned internal received beam, wherein the first input optical element comprises a polarizer;
establishing a second aligned internal received beam in the receiver chamber, wherein a first highly-efficient reflecting surface is movably mounted to a first adjusting structure that is rigidly coupled a first chamber wall, the first adjusting structure being configured to position the first highly-efficient reflecting surface at a first angle to receive the first aligned internal received beam and to establish the second aligned internal received beam;
establishing a third aligned internal received beam in the receiver chamber, wherein a second highly-efficient reflecting surface is movably mounted to a second adjusting structure that is rigidly coupled a second chamber wall, the second adjusting structure being configured to position the second highly-efficient reflecting surface at a second angle to receive the second aligned internal received beam and to establish the third aligned internal received beam;
establishing the measurement beam from the receiver chamber, wherein the second output optical element is mounted and aligned in the second pre-aligned output wall of the receiver chamber, the second output optical element having the output pinhole configured to establish the measurement beam using the third aligned internal received beam.

14. A method for aligning a Metrology Assembly comprising:
coupling a non-aligned Metrology Assembly to a test chamber, wherein a first pre-aligned wall of a source chamber is coupled to a first alignment wall of the test chamber and a second pre-aligned wall of a receiver chamber is coupled to a second alignment wall of the test chamber, wherein the first pre-aligned wall has a first pre-aligned angle, and the first alignment wall has a first alignment angle substantially equal to the first pre-aligned angle, the second pre-aligned wall having a second pre-aligned angle, the second alignment wall having a second alignment angle substantially equal to the second pre-aligned angle;
coupling an optical test source to a first pre-aligned input wall of the source chamber, the first pre-aligned input wall comprising a first input optical element having an illumination pinhole;
aligning a first source beam in the source chamber, the optical test source providing a first optical test signal having a first set of wavelengths and having a first polarization angle, wherein the optical test source, the first pre-aligned input wall, and the illumination pinhole are configured to align the first source beam using the first set of wavelengths;
aligning a second source beam in the source chamber, wherein a first highly-efficient reflecting surface is coupled to the source chamber and is positioned at a first angle to receive the first source beam and to align the second source beam;
aligning a third source beam in the source chamber, wherein a second highly-efficient reflecting surface is coupled to the source chamber and is positioned at a second angle to receive the second source beam and to establish the third source beam;
establishing a first aligned incident beam, wherein a first output optical element is aligned and mounted in a first pre-aligned output wall of the source chamber and is positioned at a third angle to receive the third source beam and to establish the first aligned incident beam;
establishing a first reflection beam using a test wafer in the test chamber;
aligning a first internal received beam in the receiver chamber, wherein a second input optical element is mounted in the second pre-aligned wall of the receiver chamber and is configured to convert the first reflection beam into the first internal received beam;
aligning a second internal received beam in the receiver chamber, wherein a first highly-efficient collecting surface is positioned to receive the first internal received beam and to establish the second internal received beam;
aligning a third internal received beam in the receiver chamber, wherein a second highly-efficient collecting surface is positioned to receive the second internal received beam and to establish the third internal received beam;
establishing an measurement beam from the receiver chamber, wherein a second output optical element is mounted and aligned in a second pre-aligned output wall of the receiver chamber, the second output optical element having an output pinhole configured to establish the measurement beam;
obtaining measurement data for the Metrology Assembly using the measurement beam and the test chamber, the test chamber being coupled to the second pre-aligned output wall of the receiver chamber using one or more second coupling elements and one or more second alignment devices;
determining an alignment error between a test incident beam and a test reflection beam;
identifying the test incident beam and the test reflection beam as pre-aligned beams and identifying the non-aligned Metrology Assembly as a Pre-Aligned Metrology Assembly when the alignment error is less than a first error limit; and
performing a corrective action when the alignment error is not less than the first error limit.

15. The method of claim 14, wherein the corrective action comprises:
aligning a movable shutter element in the source chamber, or aligning a movable ultra-violet cutoff filter, or aligning a movable measurement device, or any combination thereof.

16. A Metrology Assembly comprising:
a source chamber having one or more first attachment elements;
a first input optical element mounted and aligned in a first pre-aligned input wall of the source chamber, the first input optical element being configured to receive an input beam and to establish a first source beam within the source chamber;
a plurality of focusing elements mounted and aligned within the source chamber, wherein one or more of the focusing elements are configured to establish one or more aligned internal source beams within the source chamber using the first source beam;

a first output optical element mounted and aligned in a first pre-aligned output wall in the source chamber, the first output optical element configured to receive at least one aligned internal source beam and to establish a first aligned incident beam having a first incident angle;

a receiver chamber coupled to the source chamber and having one or more second attachment elements;

a second input optical element mounted and aligned in a second pre-aligned input wall of the receiver chamber, the second input optical element being configured to receive a reflection beam and to establish a first internal received beam within the receiver chamber;

a plurality of collecting elements mounted and aligned within the receiver chamber, wherein one or more of the collecting elements are configured to establish one or more aligned internal received beams within the receiver chamber using the first internal received beam; and a second output optical element mounted and aligned in a second pre-aligned output wall in the receiver chamber, the second output optical element including an output pinhole configured to create one or more measurement beams.

17. The Metrology Assembly as claimed in claim 16, wherein the first input optical element, the first output optical element, the second input optical element, and/or the second output optical element comprises a polarizer.

18. The Metrology Assembly as claimed in claim 16, wherein the focusing elements further comprise:
a first highly-efficient reflecting surface configured as a first focusing element, the first highly-efficient reflecting surface being coupled to a first adjusting structure, wherein the first adjusting structure is configured to position the first highly-efficient reflecting surface at a first angle, the first highly-efficient reflecting surface being configured to receive a first aligned source beam and establish a second aligned source beam; and a second highly-efficient reflecting surface configured as a second focusing element, the second highly-efficient reflecting surface being coupled to a second adjusting structure, wherein the second adjusting structure is configured to position the second highly-efficient reflecting surface at a second angle, the second highly-efficient reflecting surface being configured to receive the second aligned source beam and establish a third aligned source beam.

19. The Metrology Assembly as claimed in claim 16, wherein the collecting elements further comprise:
a first highly-efficient reflecting surface configured as a first collecting element, the first highly-efficient reflecting surface being coupled to a first adjusting structure, wherein the first adjusting structure is configured to position the first highly-efficient reflecting surface at a first angle, the first highly-efficient reflecting surface being configured to receive a first aligned internal received beam and establish a second aligned internal received beam; and a second highly-efficient reflecting surface configured as a second collecting element, the second highly-efficient reflecting surface being coupled to a second adjusting structure, wherein the second adjusting structure is configured to position the second highly-efficient reflecting surface at a second angle, the second highly-efficient reflecting surface being configured to receive the second aligned internal received beam and establish a third aligned internal received beam.

20. The Metrology Assembly of claim 16, wherein the Metrology Assembly further comprises a movable shutter element coupled to a chamber wall using a first attachment element, or a movable ultra-violet cutoff filter coupled to the chamber wall using a second attachment element, or a movable measurement device coupled to the chamber wall using a third attachment element, or any combination thereof.

* * * * *